United States Patent
Hsieh et al.

(10) Patent No.: US 9,242,853 B2
(45) Date of Patent: Jan. 26, 2016

(54) METHOD OF IMPROVING GETTER EFFICIENCY BY INCREASING SUPERFICIAL AREA

(71) Applicant: Taiwan Semiconductor Manufacturing Co., Ltd., Hsin-Chu (TW)

(72) Inventors: Yuan-Chih Hsieh, Hsinchu (TW); Li-Cheng Chu, Taipei (TW); Hung-Hua Lin, Taipei (TW); Chih-Jen Chan, Changhua (TW); Lan-Lin Chao, Sindian (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/053,751

(22) Filed: Oct. 15, 2013

(65) Prior Publication Data

US 2015/0102432 A1    Apr. 16, 2015

(51) Int. Cl.
| | |
|---|---|
| *H01L 23/31* | (2006.01) |
| *B81C 1/00* | (2006.01) |
| *H01L 23/26* | (2006.01) |
| *H01L 21/322* | (2006.01) |
| *B81B 7/00* | (2006.01) |

(52) U.S. Cl.
CPC ........... *B81C 1/00285* (2013.01); *B81B 7/0025* (2013.01); *H01L 21/3223* (2013.01); *H01L 23/26* (2013.01); *H01L 2924/0002* (2013.01)

(58) Field of Classification Search
CPC ..................... H01L 2224/48227; B81B 7/007; B81B 7/0038
See application file for complete search history.

(56) References Cited

U.S. PATENT DOCUMENTS

| | | | |
|---|---|---|---|
| 6,074,926 A * | 6/2000 | Cathey et al. ................. 438/398 |
| 7,462,931 B2 * | 12/2008 | Summers ....................... 257/704 |
| 8,485,416 B2 * | 7/2013 | Ebefors et al. ............. 228/122.1 |
| 8,945,811 B2 * | 2/2015 | True ........................... 430/270.1 |
| 2004/0061207 A1 * | 4/2004 | Ding ............................. 257/678 |
| 2011/0012247 A1 | 1/2011 | Wu |
| 2012/0280594 A1 * | 11/2012 | Chen et al. ................. 310/313 R |
| 2014/0037869 A1 * | 2/2014 | Petrmichl et al. ............... 428/34 |
| 2014/0175590 A1 * | 6/2014 | Gooch et al. .................. 257/433 |

* cited by examiner

*Primary Examiner* — John C Ingham
(74) *Attorney, Agent, or Firm* — Eschweiler & Associates, LLC (57) ABSTRACT

The present disclosure relates to a method of gettering that provides for a high efficiency gettering process by depositing a gettering material on a roughened substrate surface, and an associated apparatus. In some embodiments, the method is performed by providing a substrate into a processing chamber having residual gases. One or more cavities are formed in the substrate at locations between bonding areas on a top surface of the substrate. Respective cavities have roughened interior surfaces that vary in a plurality of directions. A getter layer is deposited into the one or more cavities. The roughened interior surfaces of the one or more cavities enable the substrate to more effectively absorb the residual gases, thereby increasing the efficiency of the gettering process.

18 Claims, 6 Drawing Sheets

METHOD OF IMPROVING GETTER EFFICIENCY BY INCREASING SUPERFICIAL AREA

BACKGROUND

Gettering is a process by which unwanted particles are removed (i.e., gettered) from a system. For example, gettering may be used to remove unwanted residual gas molecules from a processing chamber that is under vacuum. By removing the unwanted gas molecules from the chamber, the gettering process reduces a pressure of the vacuum.

Gettering may be performed within a processing chamber by using a vapor deposition technique to deposit a getter layer comprising a plurality of gettering molecules. When a residual gas molecule within the processing chamber comes into contact with a vaporized gettering molecule, the residual gas molecule will combine with the vaporized gettering molecule. The combined gas molecule and gettering molecule are subsequently deposited on the substrate, thereby removing the gas molecule from the vacuum.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

MEMs (microelectromechanical system) sensor devices often operate by sensing a characteristic of an ambient environment surrounding the device. For example, to measure an angular momentum, a MEMs vibrational gyroscope may measure a change in an electric field of vibrating particles in proximity to the device. To improve operation of a device, it may be desirable to operate at a specific pressure that enables improved measurement of a desired parameter. For example, in the case of a MEMs vibrational gyroscope, a low pressure vacuum provides for a better measurement since it mitigates background noise.

Therefore, MEMs devices typically have a hermetically-sealed chamber that is held at a controlled pressure level that enables operation of the device. To form the hermetically-sealed chamber a cap wafer may be bonded onto a device wafer having a MEMs device. To improve a vacuum within the chamber, a gettering process may be used to absorb residual gases in the processing chamber. The gettering process deposits getter layer onto the cap wafer, by a vapor deposition process, which absorbs the residual gases. However, it has been appreciated that the efficiency of the gettering process is limited by how much residual gas can be absorbed by the cap wafer.

Accordingly, the present disclosure relates to a method of gettering that provides for a high efficiency gettering process by depositing a gettering material on a roughened substrate surface, and an associated apparatus. In some embodiments, the method comprises providing a substrate into a processing chamber having residual gases. One or more cavities are formed in the substrate at locations between bonding areas on a top surface of the substrate. Respective cavities have roughened interior surfaces. A getter layer is deposited into the one or more cavities. The roughened interior surfaces of the one or more cavities enable the substrate to more effectively absorb the residual gases, thereby increasing the efficiency of the gettering process.

Figure 1:
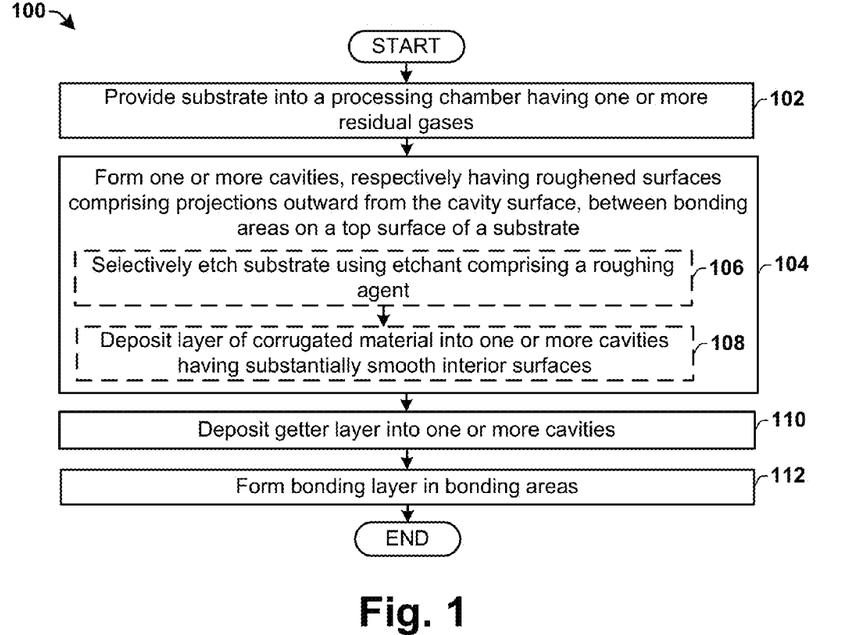
FIG. 1 illustrates a flow diagram of some embodiments of a method of gettering to remove unwanted residual gases from a system.

FIG. 1 illustrates a flow diagram of some embodiments of a method 100 of gettering. The method 100 increases gettering efficiency by depositing a getter layer onto a roughened surface.

At 102, a substrate is provided into a processing chamber having one or more residual gases. The one or more residual gases comprise gases that remain after a low pressure vacuum has been formed within the processing chamber. In some embodiments, the substrate may comprise a semiconductor substrate (e.g., a silicon substrate).

At 104, one or more cavities, respectively having roughened interior surfaces, are formed between bonding areas on a top surface of the substrate. The roughened interior surfaces comprise projections outward from the interior surfaces of a cavity, causing respective interior surfaces to vary in a plurality of directions.

In some embodiments, the roughened interior surfaces may be formed by selectively exposing the substrate to an etchant that comprises an etch chemistry having a roughing agent, at 106. For example, in some embodiments, the etchant may comprise a dry etchant comprising an etch chemistry having xenon difluoride ($XeF_2$) or sulfur hexaflouride ($SF_6$).

In other embodiments, the roughened interior surfaces may be formed by selectively depositing a layer of corrugated material, having ridges and grooves, within the one or more cavities, at 108. The layer of corrugated material has a thickness that varies as a function of position over substantially smooth surfaces of the substrate within the one or more cavities. In some embodiments, the layer of corrugated material may comprise a spin-on-glass (e.g., HSG). The layer of spin-on-glass may be deposited over smooth silicon surfaces of cavities formed within a silicon substrate.

At 110, a getter layer of getter material is deposited onto the roughened interior surfaces. The getter layer is configured to trap the one or more residual gases as the getter layer forms onto the roughened interior surfaces (e.g., the bottom and sidewalls) of the one or more cavities. Since the interior surfaces are roughened, the superficial surface area within the one or more cavities is larger (i.e., larger than that of a smooth surface), thereby enabling more efficient absorption of the one or more residual gases. In some embodiments, the getter layer may be deposited by way of a vapor deposition technique (e.g., a chemical vapor deposition, a physical vapor deposition, etc.).

At 112, a bonding layer is deposited onto the bonding areas on the top surface of the substrate. In some embodiments, the bonding layer may comprise aluminum or germanium for a eutectic bonding process, oxide for a fusion bonding process, or a metal or a polymer for a thermal compression bonding process.

Figure 2:
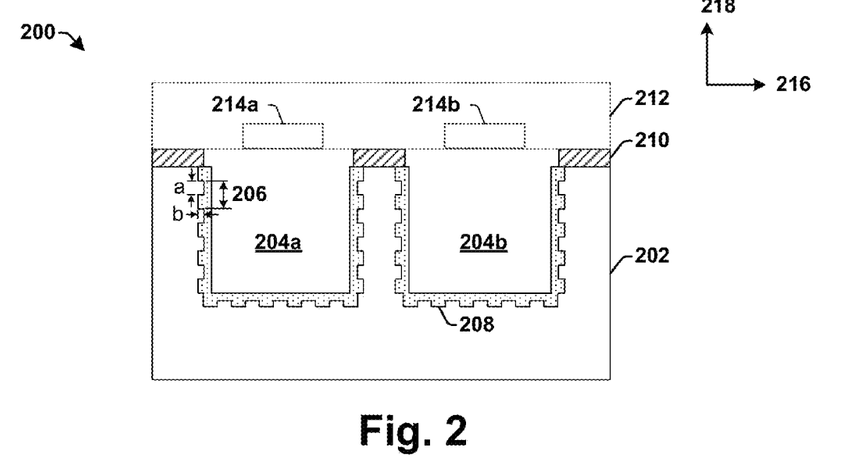
FIG. 2 illustrates a cross-sectional view of some embodiments of a substrate upon which a getter layer has been deposited.

FIG. 2 illustrates some embodiments of a cross-sectional view 200 of a substrate 202 upon which a disclosed getter layer 208 has been deposited.

The substrate 202 comprises one or more cavities, 204a and 204b. The cavities, 204a and 204b, extend from a top surface of the substrate 202 to a position within the substrate 202. In some embodiments, the substrate 202 may comprise a semiconductor material, such as silicon, for example.

The interior surfaces (i.e., the sidewalls and the bottom) of the cavities, 204a and 204b, are roughened so as to have uneven surfaces that respectively vary in a plurality of directions. For example, the interior surfaces of the cavities, 204a and 204b, may vary in a first direction 216, a second direction 218, and a combination thereof. In some embodiments, the roughened interior surfaces may comprise grooves (i.e., negative reliefs) disposed between ridges (i.e., positive reliefs) of the substrate 202.

Since the roughened interior surfaces have components that vary in a plurality of directions, the roughened interior surfaces have an increased surface area relative to that of a smooth surface (i.e., a surface that varies in the first direction 216 or the second direction 218). For example, within section 206, the roughened interior surface has a surface area that is equal to 2a+2b. Compared to a smooth surface, which would have a surface area equal to 2a in section 206, the roughened interior surface may provide for a surface area that is between approximately 20% and approximately 100% larger.

A getter layer 208 of getter material, configured to trap unwanted residual gases, is disposed at a position that is in contact with the roughened interior surfaces of the cavities, 204a and 204b. The increased surface area of the roughened interior surfaces provides for more surface area for the getter layer 208 to contact an interior surface of the substrate 202 and therefore provides for more efficient capture of the residual gases. In various embodiments, the getter layer 208 may comprise barium (Ba), titanium (Ti), zirconium (Zr), hafnium (Hf), vanadium (V), iron (Fe), cobalt (Co), aluminum (Al), and/or silicon (Si), for example.

A bonding layer 210 is disposed along the top surface of the substrate 202 at positions adjacent to the plurality of cavities, 204a and 204b. In some embodiments, the bonding layer 210 may comprise a eutectic bonding layer having a metal such as aluminum or germanium, for example. In other embodiments, the bonding layer 210 may comprise an oxide (for a fusion bonding process), or a metal or a polymer (for a thermal compression bonding process).

In some embodiments, the substrate 202 may comprise a cap wafer. In such embodiments, a device wafer 212 having a plurality of MEMs devices, 214a and 214b, may be disposed onto the bonding layer 210. The bonding layer 210 is configured to affix the device wafer 212 to the substrate 202 (i.e., cap wafer) causing the cavities, 204a and 204b, to form hermetically sealed chambers abutting the one or more MEMs devices, 214a and 214b.

Figure 3:
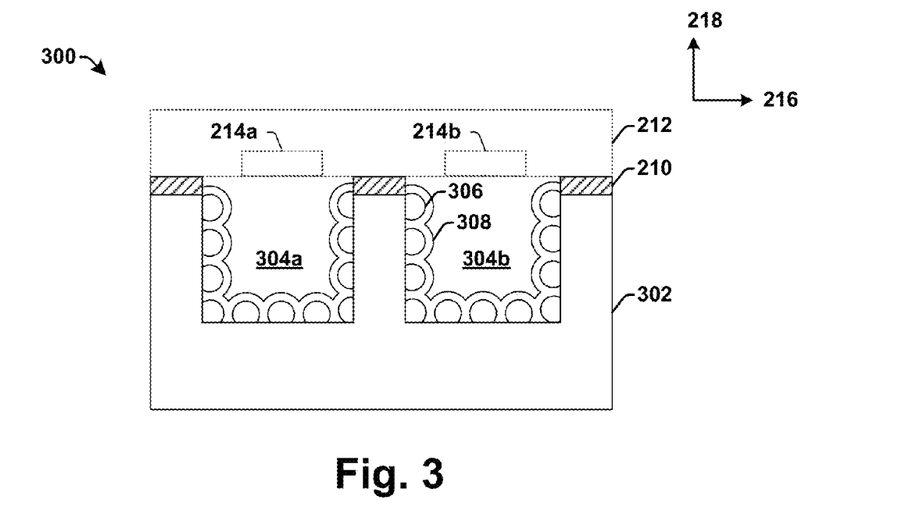
FIG. 3 illustrates a cross-sectional view of some alternative embodiments of a substrate upon which a getter layer has been deposited.

FIG. 3 illustrates some alternative embodiments of a cross-sectional view 300 of a substrate 302 upon which a getter layer 308 has been deposited.

The substrate 302 comprises one or more cavities, 304a and 304b, which extend from a top surface of the substrate 302 to a position within the substrate 302. The cavities, 304a and 304b, have a substantially smooth surface (i.e., a surface that varies in a single direction 216 or 218) made of the substrate material. For example, a silicon substrate may comprise cavities having substantially smooth silicon surfaces.

A layer of corrugated material 306 is disposed onto the interior surfaces of the cavities, 304a and 304b, at a position overlying a substantially smooth surface of the substrate 302. The layer of corrugated material 306 has a thickness that varies as a function of position, so as to provide for roughened interior surfaces of the cavities, 304a and 304b, which vary in a plurality of directions. For example, the layer of corrugated material 306 disposed on sidewalls of the cavities, 304a and 304b, may vary in both a first direction 216 and a second direction 218, perpendicular to the first direction 216. In some embodiments, the layer of corrugated material 306 may comprise a spin-on-glass, such as HSG, for example. In other embodiments, the layer of corrugated material 306 may comprise other materials having uneven thicknesses, which are disposed onto substantially smooth interior surfaces of the substrate 302 to form an uneven surface within the cavities, 304a and 304b.

A getter layer 308 of getter material, configured to trap unwanted residual gases, is disposed at a position that is in contact with the layer of corrugated material 306 on the interior surfaces of the cavities, 304a and 304b. The increased surface area provided by the layer of corrugated material 306 provides for more area for the getter layer 208 to contact an interior surface of the substrate 302 and therefore provides for more efficient capture of the residual gases.

A bonding layer 210 is disposed along the top surface of the substrate 302. In some embodiments, a device wafer 212 having a plurality of MEMS devices, 214a and 214b, may be disposed onto the bonding layer 210. The bonding layer 210 is configured to affix the device wafer 212 to the substrate 202 (i.e., a cap wafer) causing the cavities, 204a and 204b, to form hermetically sealed chambers.

It will be appreciated that the disclosed method of gettering, and associated apparatus, is not limited by the type of MEMs device or the type of bonding structures. Rather, the disclosed method of gettering may be used with different types of MEMs devices and/or for different types of bonding structures. For example, FIGS. 3-4 illustrate MEMs devices having different bonding structures.

Figure 4:
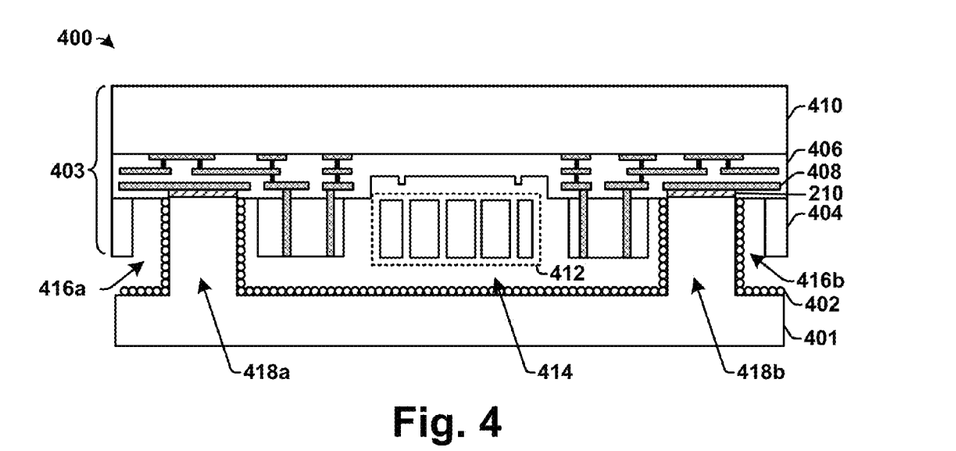
FIG. 4 illustrates a cross-sectional view of some embodiments of a MEMs (microelectromechanical system) device with a socket-type eutectic bond that provides for a chamber having a getter layer.

FIG. 4 illustrates a cross-sectional view of some embodiments of a MEMs (microelectromechanical system) structure 400 with a socket-type eutectic bond that provides for a sealed chamber 414 having a getter layer 502.

The MEMs structure 400 comprises a cap wafer 401 and a device wafer 403. The device wafer 403 comprises a MEMs device having a proof mass 412 located within a chamber 414 (e.g., a hermetically sealed chamber). The proof mass 412 is configured to move within the chamber 414 depending upon a force that operates upon the MEMs structure 400. As the proof mass 412 moves, sensors (not shown) are configured to measure changes in the system caused by the motion and to calculate a desired parameter based upon the measured changes. For example, for a MEMs accelerometer, the proof mass 412 is configured to change position based upon a force of acceleration. As the proof mass 412 moves, a change in capacitance (corresponding to the acceleration) may be measured. In various embodiments, the MEMs device may comprise a MEMs gyroscope, a MEMs accelerometer, or a MEMs pressure sensor, for example.

The device wafer 403 comprises first and second cavities, 416a and 416b, disposed within the device wafer 403. In some embodiments, the device wafer 403 comprises an inter-metal dielectric (IMD) layer 406 disposed onto a MEMs wafer 410. In some embodiments, the MEMs wafer 410 may comprise an ASIC (application specific integrated circuit) substrate. The IMD layer 406 comprises one or more metal interconnections 408 configured to electrically couple the MEMs device to one or more logic devices (e.g., CMOS transistors that make the MEMs device function), located within the MEMs wafer 410. In some embodiments, the IMD layer 406 may connect the proof mass 412 to a MEMs wafer 410 comprising one or more stacked wafers (e.g., a 2.5D integrated chip), wherein the one or more stacked wafers comprise one or more logic devices that make the MEMs device function.

In some embodiments, a semiconductor substrate 404 may be disposed onto an opposite side of the IMD layer 406 as the MEMs wafer 410. In such embodiments, the first and second cavities, 416a and 416b, may extend though the semiconductor substrate 404 to expose the IMD layer 406.

The cap wafer 401 comprises first and second standoff structures, 418a and 418b, which extend outward from the substrate 202 as positive reliefs abutting the chamber 414. The first and second standoff structures, 418a and 418b, are disposed at positions corresponding to the first and second cavities, 416a and 416b. The first and second cavities, 416a and 416b, provide an opening for the stand-off structures, 418a and 418b to bond to the IMD layer 406 at an interface comprising a bonding layer 210 configured to affix the cap wafer 401 to the device wafer 403. When the device wafer 403 is brought into contact with the cap wafer 401 the chamber 414 is formed therebetween.

A getter layer 402 is positioned on the sidewalls and the bottom of the chamber 414 at a position overlying a roughened interior surface of the chamber 414. In some embodiments, the getter layer 402 is disposed over a layer of corrugated material (e.g., spin-on-glass) having a roughened surface. In other embodiments, the getter layer 402 is disposed over a roughened surface of the cap wafer 401.

Figure 5:
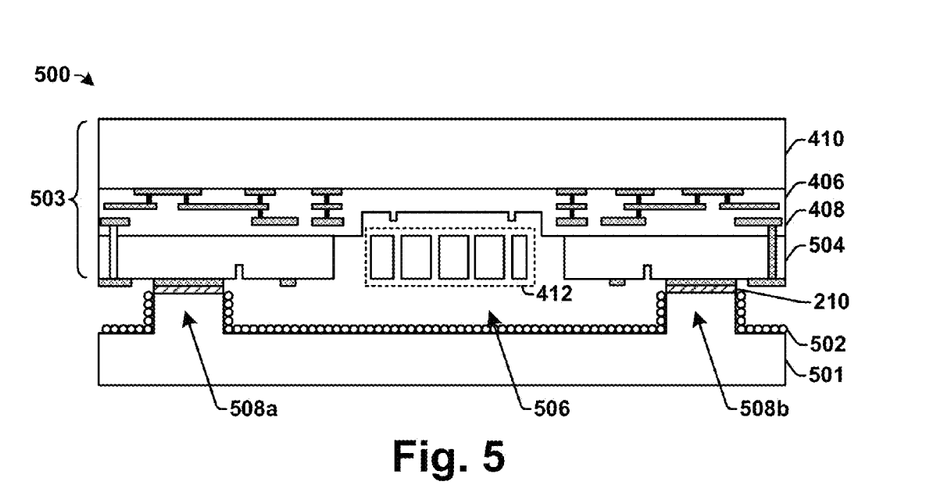
FIG. 5 illustrates a cross-sectional view of some embodiments of a MEMs device with a bond-on-MEMs-type eutectic bond that provides for a chamber having a getter layer.

FIG. 5 illustrates a cross-sectional view of some embodiments of a MEMs (microelectromechanical system) structure 500 with a bond-on-MEMs-type eutectic bond that provides for a sealed chamber having a getter layer 502.

The MEMs structure 500 comprises a cap wafer 501 and a device wafer 503 having a MEMs device. The device wafer 503 comprises a MEMs device having a proof mass 412 located within a chamber 506 (e.g., a hermetically sealed chamber). The proof mass 412 is configured to move within the chamber 506 depending upon a force that operates upon the MEMs structure 500. As the proof mass 412 moves, sensors (not shown) are configured to measure changes in the system caused by the motion and to calculate a desired parameter based upon the measured changes. In various embodiments, the MEMs device may comprise a MEMs gyroscope, a MEMs accelerometer, or a MEMs pressure sensor, for example.

In some embodiments, the device wafer 503 comprises an inter-metal dielectric (IMD) layer 406 disposed onto a MEMs wafer 410. The IMD layer 406 comprises one or more metal interconnections 408 configured to electrically couple the MEMs device to one or more logic devices (e.g., CMOS transistors) within the MEMs wafer 410. In some embodiments, a semiconductor substrate 504 may be disposed onto an opposite side of the IMD layer 406 as the MEMs wafer 410.

The cap wafer 501 is coupled to the device wafer 503 and comprises first and second standoff structures, 508a and 508b, which extend outward from a rectangular structure of the cap wafer 501 as positive reliefs abutting the chamber 506. A bonding layer 210, configured to affix the device wafer 503 to the cap wafer 501, is disposed onto the first and second standoff structures, 508a and 508b. The bonding layer 210 is configured to contact the device wafer 503 at the semiconductor substrate 504. When the device wafer 503 is brought into contact with the cap wafer 501 the chamber 506 is formed therebetween. A getter layer 502 is positioned on the sidewalls and the bottom of the chamber 506 at a position overlying a roughened interior surface of the chamber 506. In some embodiments, the getter layer 502 is disposed over a layer of corrugated material (e.g., spin-on-glass) having a roughened surface. In other embodiments, the getter layer 502 is disposed over a roughened surface of the cap wafer 501.

Figure 6:
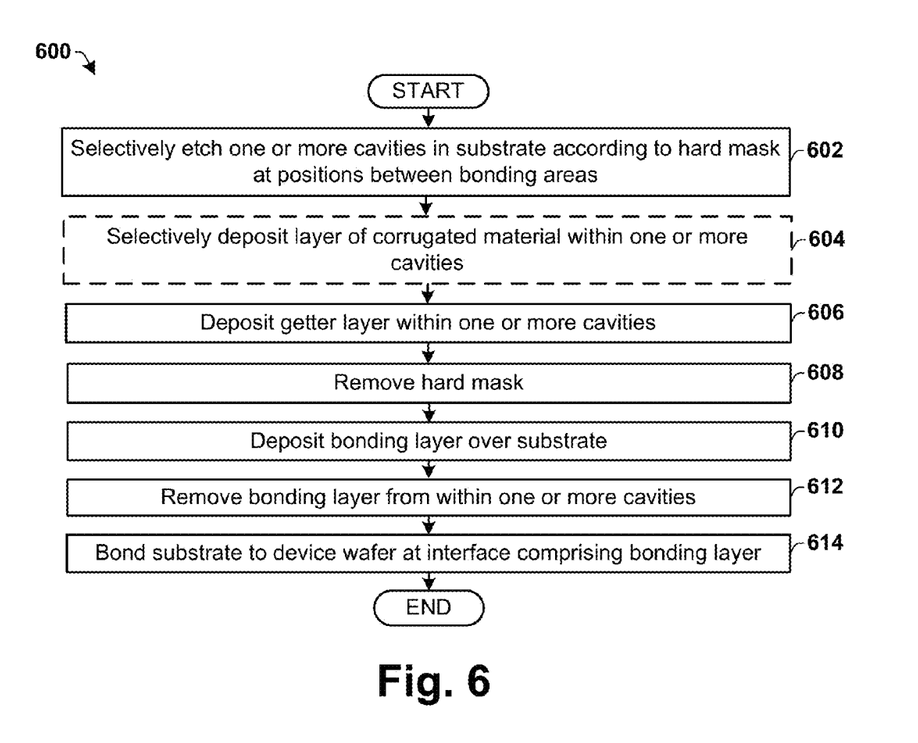
FIG. 6 illustrates a flow diagram of some embodiments of a method of gettering to remove residual gases from a MEMs cavity.

FIG. 6 illustrates a flow diagram of some embodiments of a method 600 of gettering. The method 600 increases gettering efficiency by forming a getter layer comprising gettering material on a roughened surface.

While disclosed methods (e.g., methods 100 and 600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 602, one or more cavities are selectively etched in a top surface of a substrate at positions between bonding areas. In some embodiments, the one or more cavities are selectively formed in the substrate by forming a hard mask over the substrate and then by subsequently etching the substrate according to the hard mask. In some embodiments, the substrate may be selectively etched using an etchant comprising a roughing agent, to form rough surfaces on the interior surfaces of the one or more cavities.

At 604, a layer of corrugated material may be selectively deposited in the one or more cavities, in some embodiments. In some embodiments, the layer of corrugated material may comprise a layer of HSG deposited using a process that is well known in the art in forming DRAM memory. For example, the layer of HSG may be deposited by way of chemical vapor deposition. In some embodiments, the chemical vapor deposition can use a reaction gas of silane (SiH4) within a high temperature (550°-620° C.) and low pressure chamber (~1 torr). Any HSG outside of the cavities may be subsequently removed (e.g., by way of an etching process).

At 606, a getter layer is deposited within the one or more cavities. In some embodiments, the getter layer may be deposited onto the layer of corrugated material. In other embodiments, the getter layer may be deposited onto a roughened interior surfaces of the one or more cavities.

At 608, the hard mask is removed from the bonding areas.

At 610, a bonding layer is deposited over the top surface of the substrate. In some embodiments, the bonding layer comprises a eutectic metal that is used in a eutectic bonding process. In some embodiments, the eutectic metal may comprise germanium or aluminum.

At 612, the bonding layer (e.g., eutectic metal) is selectively removed from within the one or more cavities.

At 614, the substrate is bonded to a device wafer having one or more MEMs devices at an interface comprising the bonding layer. In some embodiments, the substrate is bonded to the device wafer in-situ (i.e., without removing the substrate from a processing chamber) so that the bonding occurs at the reduced pressure achieved by the disclosed gettering process.

FIGS. 7-13 illustrate cross-sectional views of some embodiments of a substrate upon which a method of gettering is performed. Although FIGS. 7-13 are described in relation to method 600, it will be appreciated that the structures disclosed in FIGS. 7-13 are not limited to such a method, but instead may stand alone as a structure.

Figure 7:
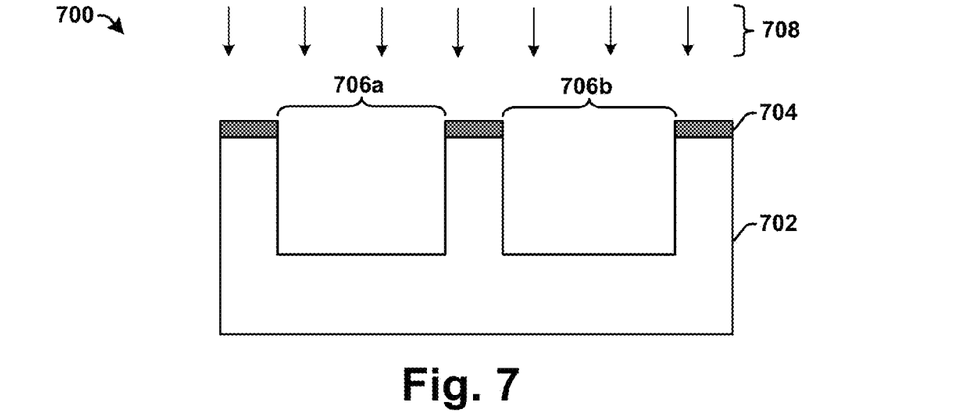
FIGS. 7-13 illustrate cross-sectional views of some embodiments of a substrate upon which a method of gettering is performed.

FIG. 7 illustrates some embodiments of a cross-sectional view 700 corresponding to act 602. As shown in cross-sectional view 700, a hard mask 704 is selectively formed onto the top surface of a substrate 702. The hard mask 704 is formed to define the location of one or more cavities, 706a and 706b, within the substrate 702. In some embodiments, the hard mask 704 may be deposited in bonding areas that correspond to a location at which the substrate 702 is bonded to a device wafer having one or more MEMs devices. In some embodiments, the hard mask 704 may comprise an oxide. In other embodiments, the hard mask 704 may comprise a nitride (e.g., SiN).

The substrate 702 is exposed to an etchant 708 that selectively removes parts of the substrate 702 in areas not masked by the hard mask 704 to form the one or more cavities, 706a and 706b, within openings in the hard mask 704. In some embodiments, the etchant 708 may comprise a dry etchant used in a dry reactive ion etching (DRIE) process. In some embodiments, the etchant 708 may comprise a dry etchant comprising a roughing agent configured to form a roughened interior surfaces within the one or more cavities 706a and 706b. For example, in some embodiments, the etchant 708 may comprise an etch chemistry having xenon difluoride ($XeF_2$) or sulfur hexaflouride ($SF_6$).

Figure 8:
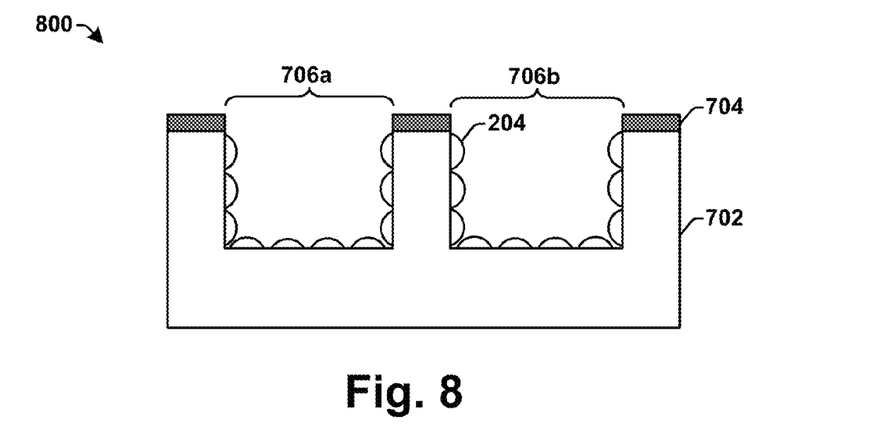

FIG. 8 illustrates some embodiments of a cross-sectional view 800 corresponding to act 604. As shown in cross-sectional view 800, a layer of corrugated material 306 (e.g., spin-on-glass) is deposited within the one or more cavities, 706a and 706b. The layer of corrugated material 306 (e.g., spin-on-glass) has a thickness that varies as a function of position so as to provide for roughened (i.e., uneven) interior surfaces that vary in a plurality of directions. In some embodiments, the layer of corrugated material 306 may comprise HSG.

Figure 9:
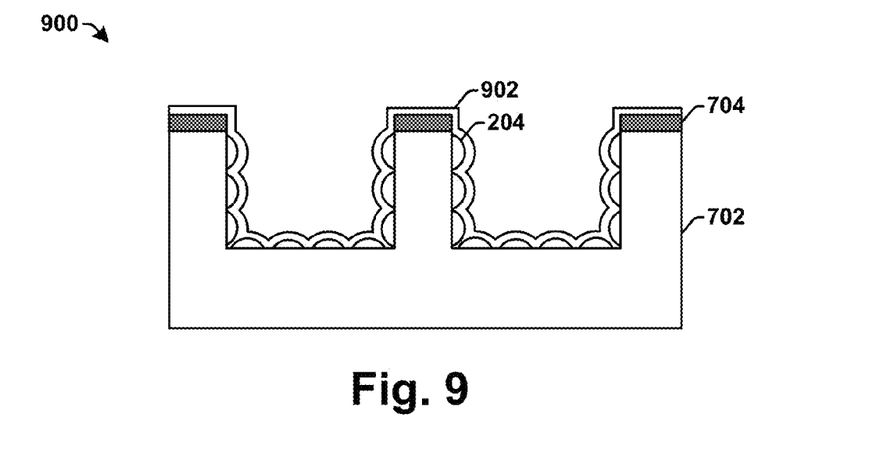

FIG. 9 illustrates some embodiments of a cross-sectional view 900 corresponding to act 606. As shown in cross-sectional view 900, a getter layer 902 is deposited as a blanket deposition over the substrate 702 (i.e., over the hard mask 704 and within the cavities, 706a and 706b). In some embodiments, the getter layer 902 may be deposited by a vapor deposition technique, such as a physical vapor deposition or a chemical vapor deposition. In various embodiments, the getter layer 902 may comprise barium (Ba), titanium (Ti), zirconium (Zr), hafnium (Hf), vanadium (V), iron (Fe), cobalt (Co), aluminum (Al), or silicon (Si), for example.

Figure 10:
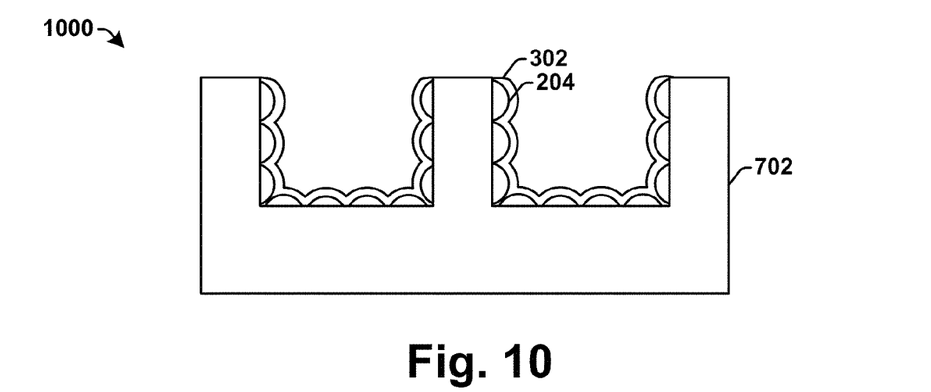

FIG. 10 illustrates some embodiments of a cross-sectional view 1000 corresponding to act 608. As shown in cross-sectional view 1000, the hard mask 704 is removed from the top surface of the substrate 702. By removing the hard mask 704 from the top surface of the substrate 702, the overlying getter layer 902 is also removed from the top surface of the substrate 702 within the bonding areas.

Figure 11:
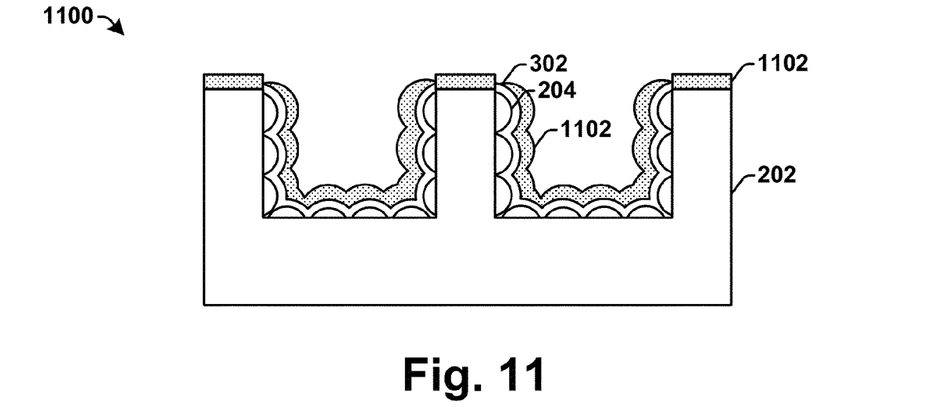

FIG. 11 illustrates some embodiments of a cross-sectional view 1100 corresponding to act 610. As shown in cross-sectional view 1100, a layer of eutectic metal 1102 is deposited over the substrate (i.e., within the bonding areas and the cavities, 706a and 706b). In some embodiments, the layer of eutectic metal 1102 may be deposited by physical vapor deposition or by a chemical vapor deposition technique. In various embodiments, the layer of eutectic metal 1102 may comprise aluminum or germanium, for example.

Figure 12:
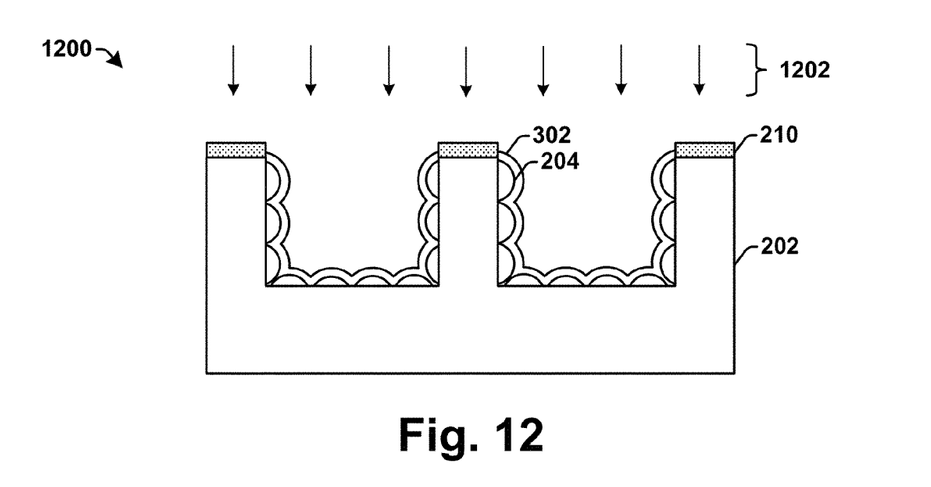

FIG. 12 illustrates some embodiments of a cross-sectional view 1200 corresponding to act 612. As shown in cross-sectional view 1200, the layer of eutectic metal 1102 is selectively removed from the one or more cavities, 706a and 706b. In some embodiments, the layer of eutectic metal 1102 may be removed by masking the layer of eutectic metal 1102 within the bonding areas and selectively etching the eutectic metal 1102 within the one or more cavities, 706a and 706b.

Figure 13:
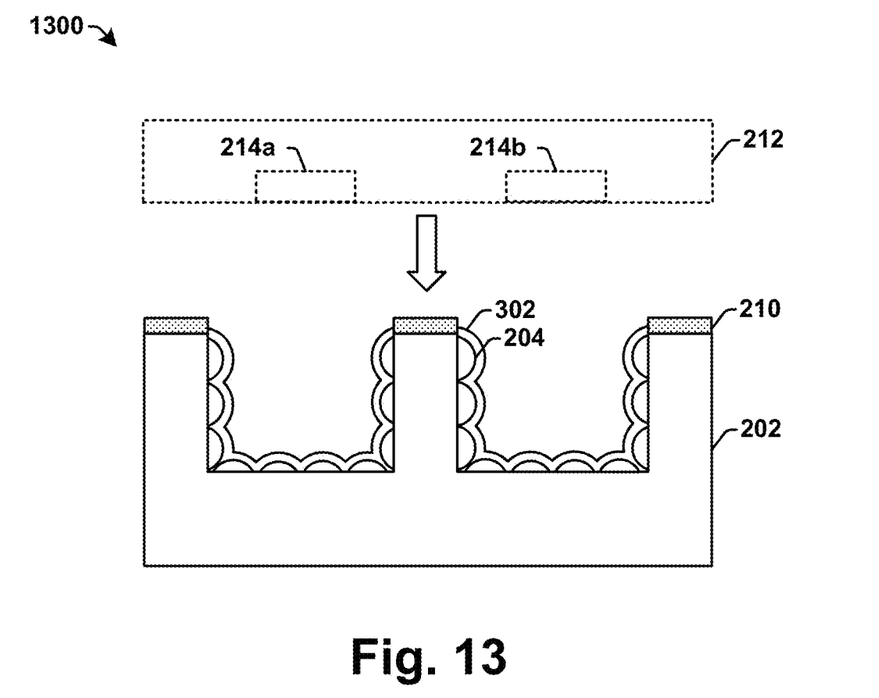

FIG. 13 illustrates some embodiments of a cross-sectional view 1300 corresponding to act 614. As shown in cross-sectional view 1300, a device wafer 212 having one or more MEMs devices, 214a and 214b, may be brought into contact with the substrate 702 at an interface comprising the eutectic metal 1102. Bringing the device wafer 212 into contact with the substrate 702 results in the formation of sealed chambers abutting the one or more MEMs devices, 214a and 214b.

It will be appreciated that while reference is made throughout this document to exemplary structures in discussing aspects of methodologies described herein (e.g., the structure presented in FIGS. 7-13, while discussing the methodology set forth in FIG. 6), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a method of gettering that provides for a high efficiency gettering process by depositing a gettering material on a roughened substrate surface, and an associated apparatus.

In some embodiments, the present disclosure relates to a method of forming getter material. The method comprises providing a substrate into a processing chamber having one or more residual gases. The method further comprises forming one or more cavities located between bonding areas on a top surface of the substrate, wherein respective cavities have roughened interior surfaces. The method further comprises depositing a getter layer configured to absorb the one or more residual gases within the one or more cavities.

In other embodiments, the present disclosure relates to a method of forming getter material. The method comprises forming one or more cavities having roughened interior surfaces within a substrate by selectively etching the substrate using an etchant comprising a roughing agent, or by selectively depositing a layer of corrugated material into the one or more cavities, which are formed using an alternative etchant that provides for substantially smooth surfaces within the one or more cavities. The method further comprises depositing a getter layer configured to absorb residual gases onto the roughened interior surfaces.

In yet other embodiments, the present disclosure relates to a MEMs (microelectromechanical system) device. The MEMs device comprises a substrate comprising a one or more cavities disposed between bonding areas on a top surface of the substrate, wherein the one or more cavities comprise roughened interior surfaces that respectively vary in a plurality of directions. The MEMs device further comprises a getter material disposed over the roughened interior surfaces of the one or more cavities.

What is claimed is:

1. A method of forming getter material, comprising:
   providing a substrate into a processing chamber having one or more residual gases;
   forming one or more cavities located between bonding areas on a top surface of the substrate by selectively forming a hard mask on the top surface of the substrate to define the location of the one or more cavities, and selectively exposing the substrate to an etchant that removes parts of the substrate in areas not masked by the hard mask, wherein respective cavities have a roughened interior lower surface and roughened sidewall surfaces; and
   forming a getter layer configured to absorb the one or more residual gases within the one or more cavities by depositing the getter layer onto the hard mask and within the one or more cavities, and removing the hard mask and the getter layer from the bonding areas.

2. The method of claim 1, wherein forming the one or more cavities comprises selectively etching the substrate using an etchant comprising a roughing agent.

3. The method of claim 2, wherein the roughing agent comprises xenon difluoride ($XeF_2$) or sulfur hexaflouride ($SF_6$).

4. The method of claim 1, wherein forming the one or more cavities comprises selectively depositing a layer of corrugated material having an uneven thickness onto substantially smooth surfaces within the one or more cavities.

5. The method of claim 1, further comprising:
   depositing a eutectic metal configured to enable a eutectic bonding onto the top surface of the substrate at positions within the bonding areas.

6. The method of claim 5, further comprising:
   bringing a device wafer, comprising one or more MEMs (microelectromechanical system) devices, into contact with the eutectic metal to form one or more sealed chambers abutting the one or more MEMs devices.

7. A method of forming getter material, comprising:
   selectively etching a substrate using an etchant to form one or more cavities that have substantially smooth interior surfaces; and
   depositing a layer of corrugated material onto the substantially smooth interior surfaces of the one or more cavities, wherein the layer of corrugated material forms roughened interior surfaces within the one or more cavities; and
   depositing a getter layer configured to absorb residual gases onto the roughened interior surfaces.

8. The method of claim 7, further comprising:
   depositing a eutectic metal configured to enable a eutectic bonding over the substrate.

9. The method of claim 8, further comprising:
   selectively etching the eutectic metal to remove the eutectic metal from within the one or more cavities.

10. The method of claim 8, further comprising:
    bringing a device wafer, comprising one or more MEMs (microelectromechanical system) devices, into contact with the eutectic metal to form one or more sealed chambers abutting the one or more MEMs devices.

11. The method of claim 7, wherein the layer of corrugated material comprises a layer of HSG (hemispherical grained silicon) deposited by way of a chemical vapor deposition process.

12. The method of claim 7, wherein the layer of corrugated material comprises a spin-on-glass.

13. A method of forming getter material, comprising:
    selectively etching one or more cavities in a substrate at positions between bonding areas according to a hard mask, wherein respective cavities have roughened interior surfaces;
    depositing a getter layer onto the roughened interior surfaces within the one or more cavities;
    removing the hard mask;
    depositing a bonding layer onto the substrate within the bonding areas;
    removing the bonding layer from within the one or more cavities in a manner that leaves the bonding layer within the bonding areas; and
    bonding the substrate to a device substrate comprising one or more MEMs devices at an interface comprising the bonding layer to form one or more hermetically sealed chambers respectively abutting the one or more MEMs devices.

14. The method of claim 13, wherein the roughened interior surfaces comprise an uneven surface of the substrate.

15. The method of claim 13, wherein the roughened interior surfaces comprise a layer of corrugated material having a varying thickness disposed within the one or more cavities over substantially smooth surfaces comprising a material of the substrate.

16. The method of claim 15, wherein the layer of corrugated material comprises a spin-on-glass.

17. The method of claim 15, wherein the layer of corrugated material comprises a layer of HSG (hemispherical grained silicon) deposited by way of a chemical vapor deposition process.

18. The method of claim 13, wherein the getter layer comprises barium (Ba), titanium (Ti), zirconium (Zr), hafnium (Hf), vanadium (V), iron (Fe), cobalt (Co), aluminum (Al), or silicon (Si).

* * * * *